(12) United States Patent
Maidee

(10) Patent No.: US 10,909,292 B1
(45) Date of Patent: Feb. 2, 2021

(54) IMPLEMENTING CIRCUIT DESIGNS ON MULTI-DIE PROGRAMMABLE DEVICES

(71) Applicant: Xilinx, Inc., San Jose, CA (US)

(72) Inventor: Pongstorn Maidee, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/276,336

(22) Filed: Feb. 14, 2019

(51) Int. Cl.
*G06F 30/34* (2020.01)
*H03K 19/17728* (2020.01)
*H03K 19/173* (2006.01)
*G06F 30/394* (2020.01)

(52) U.S. Cl.
CPC .......... *G06F 30/34* (2020.01); *G06F 30/394* (2020.01); *H03K 19/1737* (2013.01); *H03K 19/17728* (2013.01)

(58) Field of Classification Search
CPC ...... G06F 30/34; G06F 30/327; G06F 30/394; H01L 2924/1433; H01L 19/017581; H01L 19/17728; H01L 9/1737; H03K 19/017581; H03K 19/17728; H03K 9/1737
See application file for complete search history.

(56) References Cited

U.S. PATENT DOCUMENTS

| | | | | |
|---|---|---|---|---|
| 5,369,314 A | * | 11/1994 | Patel | H03K 19/00392 326/13 |
| 5,550,782 A | * | 8/1996 | Cliff | G11C 8/12 326/40 |
| 5,646,545 A | * | 7/1997 | Trimberger | G06F 30/34 326/38 |
| 5,682,107 A | * | 10/1997 | Tavana | H03K 19/17704 326/39 |
| 6,911,840 B1 | * | 6/2005 | Milne | H03K 19/17732 326/37 |
| 7,117,416 B1 | * | 10/2006 | Fox | G01R 31/318516 714/733 |
| 7,149,996 B1 | * | 12/2006 | Lysaght | H04Q 3/54533 326/38 |

(Continued)

OTHER PUBLICATIONS

Ginosar, Ran, "Metastability and Synchronizers: A Tutorial", IEEE Design & Test of Computers, Sep./Oct. 2011, pp. 23-35, IEEE, Piscataway, New Jersey, USA.

(Continued)

*Primary Examiner* — Helen Rossoshek
(74) *Attorney, Agent, or Firm* — Patterson + Sheridan, LLP

(57) ABSTRACT

In an example, a configurable block for a programmable device of a plurality of programmable devices in an integrated circuit (IC) includes a first flip-flop having a data port coupled to an output of an interface block of the programmable device, a clock port coupled to a first clock input, and an output port coupled to a first output. The configurable block further includes a second flip-flop having a data port coupled to the output of the interface block, a clock port coupled to the first clock input, and an output port coupled to a second output, and a first multiplexer having a first input port coupled to the output port of the first flip-flop, and a second input port coupled to the output port of the second flip-flop. The configurable block further includes a third flip-flop having an input port coupled to an output of the first multiplexer, a clock port coupled to a second clock input, and an output port coupled to a third output.

16 Claims, 15 Drawing Sheets

(56) References Cited

U.S. PATENT DOCUMENTS

| | | | |
|---|---|---|---|
| 7,183,798 B1* | 2/2007 | He | H03K 19/17728 326/38 |
| 8,010,590 B1* | 8/2011 | Taylor | H03K 19/177 708/230 |
| 8,539,011 B1* | 9/2013 | Taylor | H03K 19/17728 708/232 |
| 8,704,548 B1* | 4/2014 | Hutton | H03K 19/17744 326/41 |
| 8,941,409 B2* | 1/2015 | Voogel | H03K 19/17744 326/38 |
| 9,207,908 B1* | 12/2015 | Langhammer | G06F 7/44 |
| 9,208,109 B2* | 12/2015 | Chu | G06F 13/1626 |
| 9,348,750 B1* | 5/2016 | Knopp | G06F 12/04 |
| 9,660,650 B1* | 5/2017 | Manohararajah | H03K 19/17728 |
| 10,020,812 B1* | 7/2018 | Langhammer | H03K 19/17724 |
| 10,523,207 B2* | 12/2019 | How | H03K 19/17732 |
| 10,630,296 B2* | 4/2020 | Lee | H01L 24/13 |
| 2003/0052713 A1* | 3/2003 | Langhammer | H03K 19/17732 326/40 |
| 2007/0263618 A1* | 11/2007 | Ornes | H04Q 3/521 370/386 |
| 2015/0109024 A1* | 4/2015 | Abdelfattah | G06F 30/34 326/41 |
| 2016/0182054 A1* | 6/2016 | Westwick | H03K 19/1737 326/38 |
| 2016/0344629 A1* | 11/2016 | Gray | H04L 45/60 |
| 2019/0041923 A1* | 2/2019 | Atsatt | G06F 1/3287 |
| 2019/0044515 A1* | 2/2019 | Gutala | G11C 11/417 |
| 2019/0131976 A1* | 5/2019 | Chandrasekar | H01L 23/5381 |
| 2019/0238134 A1* | 8/2019 | Lee | H01L 23/5389 |
| 2020/0082885 A1* | 3/2020 | Lin | G11C 14/0081 |

OTHER PUBLICATIONS

Dally, William J. et al., "The Even/Odd Synchronizationer: a Fast, All-Digital Periodic Synchronizer," Proc. of the 2010 IEEE Symposium on Asynchronous Circuit and Systems, May 3, 2010, pp. 75-85, IEEE, Piscataway, New Jersey, USA.

* cited by examiner

IMPLEMENTING CIRCUIT DESIGNS ON MULTI-DIE PROGRAMMABLE DEVICES

TECHNICAL FIELD

Examples of the present disclosure generally relate to electronic circuits and, in particular, to implementing circuit designs on multi-die programmable devices.

BACKGROUND

Programmable devices can include multiple integrated circuit (IC) dies disposed on an interposer substrate. The IC dies are interconnected using conductors on the interposer. Within each programmable IC die, an interface block that is coupled to the conductors on the interposer is provided. This enables communication between interface blocks of multiple programmable IC dies. However, the number of interposers in a given programmable IC die are limited, which creates constriction when implementing circuit designs. Furthermore, to guard against process-voltage-temperature (PVT) variations among dies, a timing budget is imposed on any signal crossing between dies, which limits crossing frequency. As a result, implementing circuit designs on multi-die programmable devices is challenging in both the number of signal crossings between IC dies and the crossing frequency.

SUMMARY

Techniques for implementing circuit designs on multi-die programmable devices are described. In an example, a configurable block for a programmable device of a plurality of programmable devices in an integrated circuit (IC) includes: a first flip-flop having a data port coupled to an output of an interface block of the programmable device, a clock port coupled to a first clock input, and an output port coupled to a first output; a second flip-flop having a data port coupled to the output of the interface block, a clock port coupled to the first clock input, and an output port coupled to a second output; a first multiplexer having a first input port coupled to the output port of the first flip-flop, and a second input port coupled to the output port of the second flip-flop; and a third flip-flop having an input port coupled to an output of the first multiplexer, a clock port coupled to a second clock input, and an output port coupled to a third output.

In another example, a programmable device mounted on an interposer in an integrated circuit (IC) includes: a programmable fabric; an interface block; and a configurable block. The configurable block includes: a first flip-flop having a data port coupled to the interface block, a clock port coupled to a first clock input, and an output port coupled to a first output; a second flip-flop having a data port coupled to the output of the interface block, a clock port coupled to the first clock input, and an output port coupled to a second output; a first multiplexer having a first input port coupled to the output port of the first flip-flop, and a second input port coupled to the output port of the second flip-flop; and a third flip-flop having an input port coupled to an output of the first multiplexer, a clock port coupled to a second clock input, and an output port coupled to a third output.

In an example, a method of circuit design for a plurality of programmable devices disposed on an interposer in an integrated circuit (IC) package includes: receiving a netlist having a plurality of marked nets, each of the plurality of marked nets being indicated as allowed to cross between programmable devices in the plurality of programmable devices; and partitioning the netlist across the plurality of programmable devices by connecting one or more of the marked nets between configurable blocks in the plurality of programmable devices.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
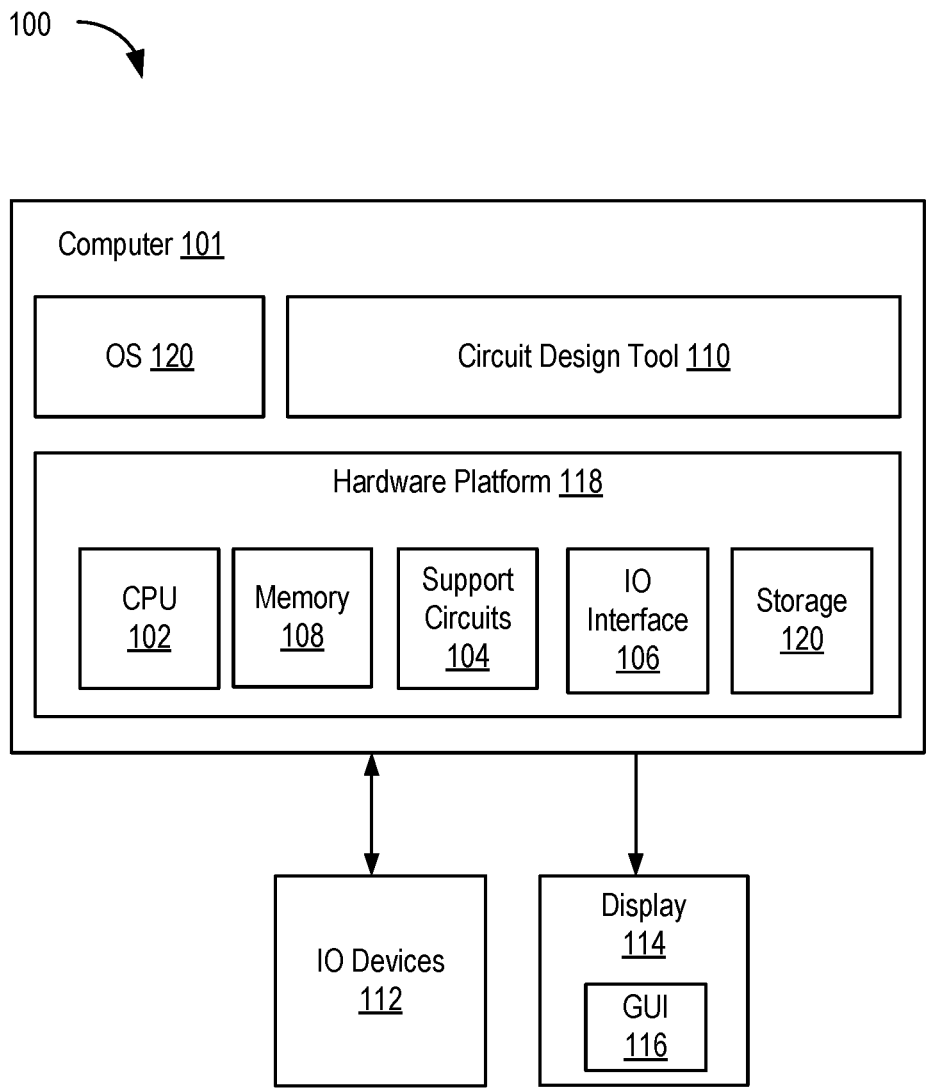
FIG. 1 is a block diagram depicting an example of a circuit design system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques to implement designs on multi-die programmable devices without iterating through several implementations for each designer's decision for inter-die signal crossings are described. The techniques leverage a configurable block, described herein, to evaluate different crossing options to meet the design requirement in one implementation run, reducing the compile time.

For a large and highly-connected circuit design, floorplaning modules within the design to different programmable IC dies to minimize the number of signals crossing between dies is generally required to address the two challenges. Despite the best floorplaning effort, the demand on inter-die interface blocks can still be higher than the supply such that the design is not routable due to congestion. In such cases, a designer needs to manually add a circuit to multiplex and de-multiplex crossing signals. This seemingly simple scheme makes the already complex iteration even more complex due to the high frequency requirement of the multiplexed signals. As a result, floorplaning alone is often insufficient because an inter-die signal crossing frequency problem is usually discovered later in the flow during implementation phase. Designers can improve the frequency by limiting inter-die signal penalty using clock root manipulation. A mesochronous synchronizer circuit must be manually added to help eliminate the large clock skew, which is a side effect of such manipulation. Designer decisions on which signals to add the synchronizer circuit and/or multiplexing circuit are usually a reaction to previous results of the design tools, requiring several iterations to converge and thus causing long compile times.

Since both the number of interface blocks needed and the crossing frequency can be observed in the design flow, it is desirable for the implementation tools to handle such extra circuit insertion internally to optimally resolve the problem. However, current design tools do not automatically insert such circuits because 1) additional resources needed by the circuits will invalidate significant portion of the placement which inevitably alter the problem and 2) additional latency of the inserted circuits may change the design functionality.

The techniques described herein provide a configurable block that is used to connect interface blocks to fabric interconnects. The block is capable of implementing different circuits required for various inter-die signal crossing situations. It minimizes perturbation to the exiting placement. Techniques of using such block in the design tool are also described. The techniques eliminate the need for multiple iterations, reducing the compile time by several-fold and potentially providing better implementation in term of congestion and timing that otherwise unachievable by the existing flow. The techniques also allow a design produced through high-level design entry to reap the benefit of using specialized circuits for inter-die signal crossing, where a human-directed multiple-iteration flow, mentioned above, is not applicable otherwise.

FIG. 1 is a block diagram depicting an example of a circuit design system 100. The circuit design system 100 includes a computer 101 coupled to input/output (IO) devices 112 and a display 114. The computer 101 includes a hardware platform 118 can include conventional components of a computing device, such as a central processing unit (CPU) 102, system memory 108, various support circuits 104, storage 120, and an IO interface 106. The CPU 102 can include one or more microprocessors. The CPU 102 is configured to execute instructions that perform one or more operations described herein. The instructions can be stored in system memory 108, storage 120, or any other memory in the hardware platform 118 (e.g., cache memory). The system memory 108 includes devices that store information and can include, for example, random access memory (RAM), read-only memory (ROM), or a combination thereof. The storage 120 includes local storage devices, such as hard disks, flash memory modules, solid state disks, optical disks, and the like. The storage 120 can also include interface(s) configured for communication with one or more network data storage systems. The support circuits 104 can include conventional cache, power supplies, clock circuits, data registers, IO interfaces, and the like. The IO interface 106 includes conventional interfaces to the computer 101 known in the art. The IO interface 106 can be coupled to the IO devices 112, which can include conventional keyboard, mouse, and the like. The IO interface 106 can also be coupled to the display 114, which can present a GUI 116 to a user.

The computer 101 further includes a software platform comprising an operating system (OS) 122 and a circuit design tool 110. The OS 122 and the circuit design tool 110 include instructions that are executed by the CPU 102. The OS 122 can include any known operating system, such as Linux®, Microsoft Windows®, Mac OS®, and the like. The circuit design tool 110 is an application that executes within the OS 122, which provides an interface to the hardware platform 118. Operation of the circuit design tool 110 is discussed below. An example circuit design tool that can be adapted to include the techniques described herein is the Vivado® Design Suite available from Xilinx, Inc. of San Jose, Calif., although other circuit design tools can be similarly adapted.

Figure 2A:
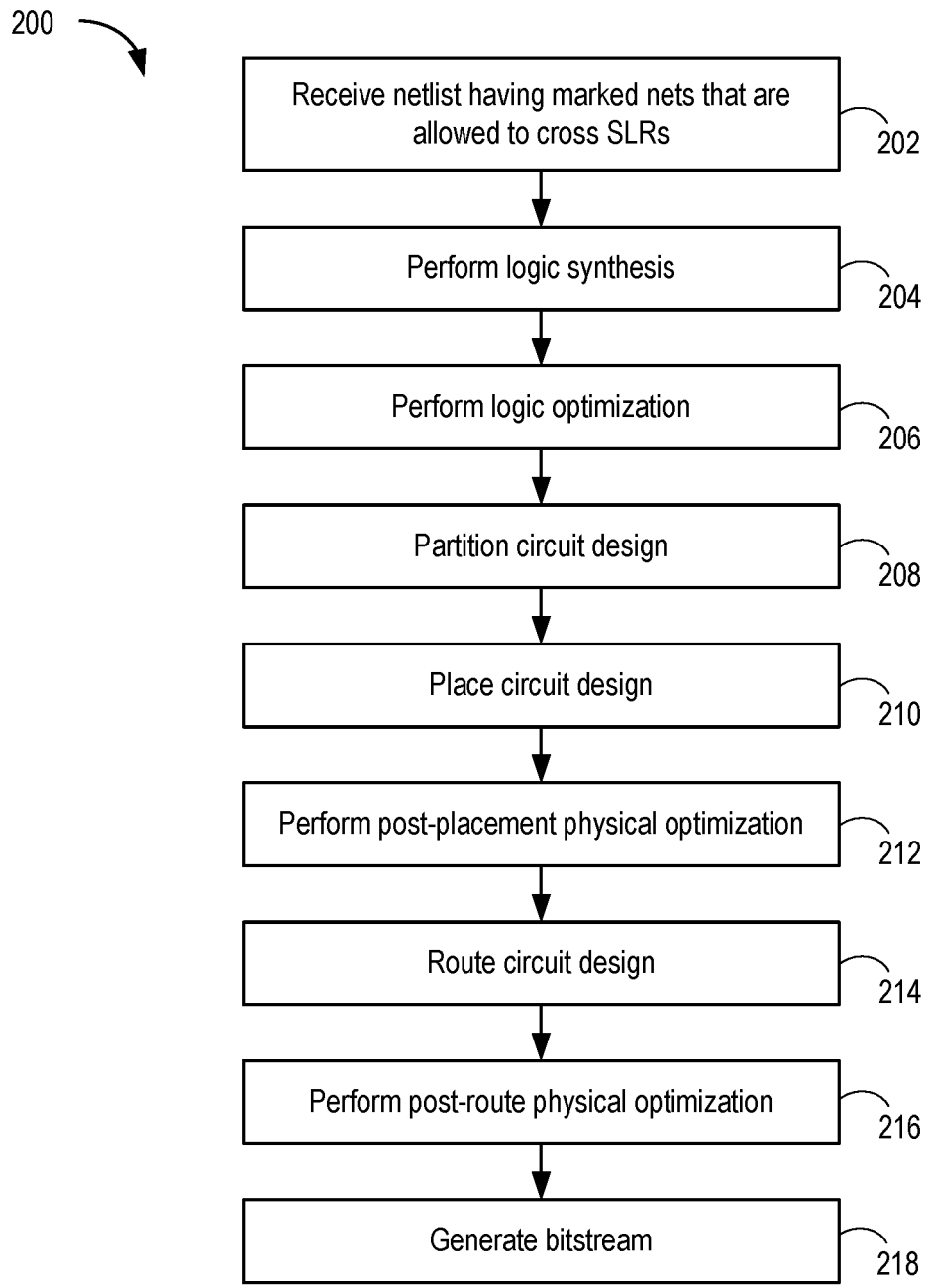
FIG. 2A is a flow diagram depicting a method of circuit design according to an example.

FIG. 2A is a flow diagram depicting a method 200 of circuit design according to an example. The method 200 can be performed by the circuit design tool 110 described above. The circuit design tool 110 generates an abstract description of the circuit, which is processed into a physical description of the circuit for implementation in a target IC ("target hardware"). The circuit design tool 110 can process the abstract description of the circuit through various intermediate transformations to produce the physical implementation of the circuit. For a programmable device, a physical implementation of a circuit can be formatted and loaded into the programmable device to produce a physical circuit. Thus, the circuit design tool 110 transforms an abstract representation of the circuit (the abstract description) into a physical representation of the circuit (the physical description) that can be formatted to binary data (the physical implementation) that can be used to realize physical circuits in the target hardware.

The method 200 begins at step 202, where the circuit design tool 110 receives a netlist having marked nets that are allowed to cross super-logic region (SLR) boundaries. A user can interact with the circuit design tool 110 to specify source files. The source files can include register-transfer level (RTL) source, which includes one or more files specifying the circuit at various levels of abstraction, such as a high-level block model of the circuit, a lower level hardware description language (HDL) model of the circuit, or the like. In general, the RTL source has little or no dependence on the target hardware. The circuit design tool 110 generates the netlist from the RTL source. At this point, the netlist is a functional description of the circuit. The functional description can include descriptions for a plurality of circuit components, such as flip-flops, memories, logic gates, processors, and the like, coupled together by connections (referred to as "nets" or "signals").

For circuit implementation, it is assumed the programmable device includes a plurality of integrated circuit (IC) dies disposed on an interposer, where each IC die provides a respective SLR. Super long lines (SLLs) are implemented on the interposer to connect signals between different SLRs. A circuit designer generates a netlist and marks those nets that are allowed to cross SLRs (e.g., by annotating the netlist). By doing so, the designer indicates that additional clock cycle latency on these nets will not affect the circuit functionality. This is important, as the method 200 may insert a configurable block for SLR crossing to the marked net that will add some latency to the net. Nets with no such marker can still cross SLRs, but such nets will not take full benefit of the configurable block. Therefore, in general, nets should be marked as much as possible. In the method 200, the marked net can be thought of as if the net goes through a module with one input and one output. However, whether such a module is used is implementation dependent.

At step 204, the circuit design tool 110 performs logic synthesis to generate a logical description of the circuit from the functional description specified in the RTL source. The logical description includes a logical representation of the circuit in terms of specific logic elements. For example, the circuit design tool 110 can perform "technology mapping" that transforms generic circuit elements into technology-specific circuit elements. For example, the logical description can include a representation of the circuit in terms of specific logic elements optimized to the architecture of a programmable IC, such as lookup tables (LUTs), carry logic, IO buffers, and like technology-specific components. In another example, the logical description can include a representation of the circuit in terms of gates, flip-flops, and the like (sometimes referred to as a "gate-level description").

At step 206, the circuit design tool 110 performs logic optimization on the synthesized netlist. Logic optimization can be performed on the logical design to make the design fit onto the target programmable device. At step 208, the circuit design tool 110 partitions the optimized circuit across the SLRs of the programmable device. In particular, marking nets allows for automatic partition and optimization within the design flow. During partitioning, the design can be represented as a group of sub-circuits connecting to each other by marked nets.

Figure 2B:
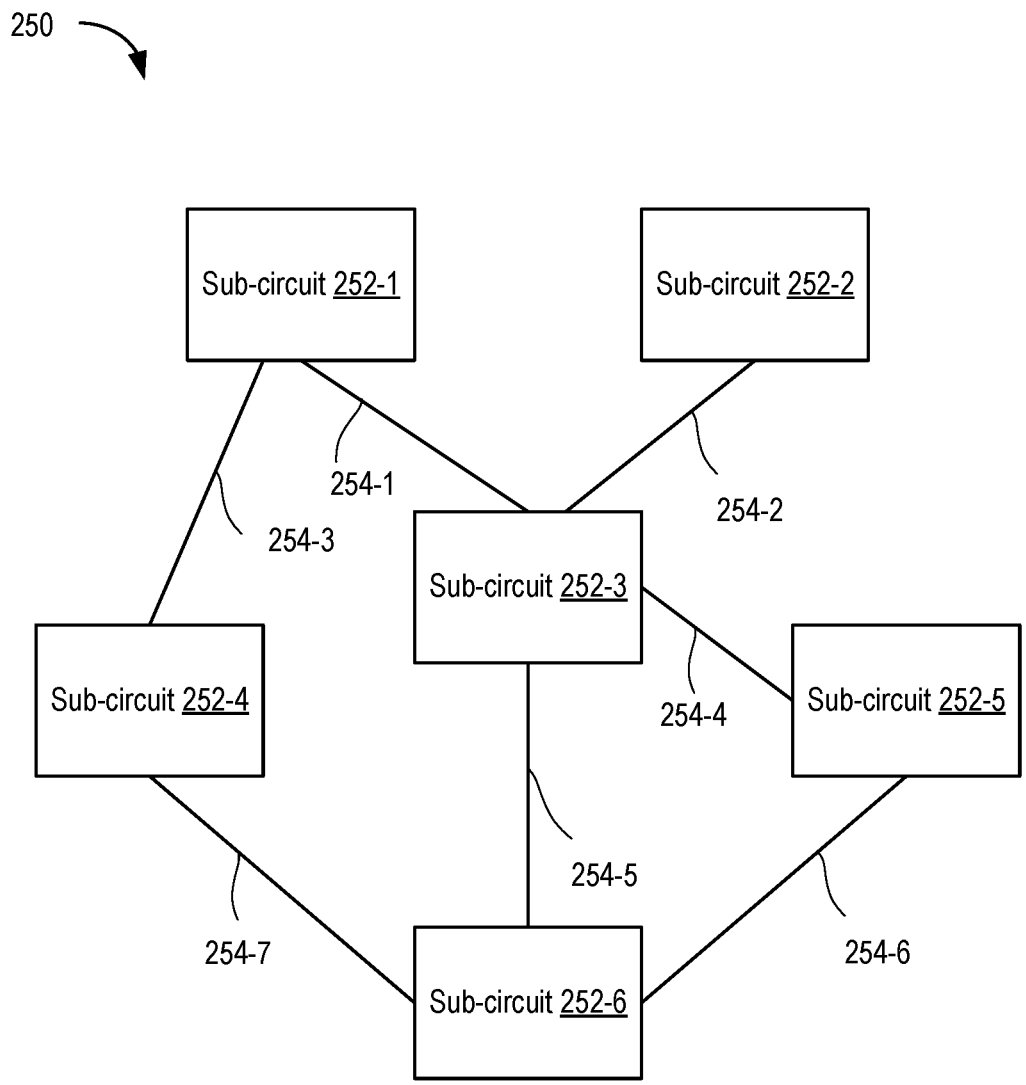
FIG. 2B is a block diagram depicting a circuit representation having marked nets according to an example.

FIG. 2B is a block diagram depicting a circuit representation 250 having marked nets according to an example. The circuit representation 250 includes a plurality of sub-circuits 252 (e.g., sub-circuits 252-1 through 252-6). The sub-circuits 252 are connected by marked nets 254 (e.g., marked nets 254-1 through 254-7). Such a coarse representation allows for fast exploration of various partitions. The representation is suitable for any partitioning algorithm. If the circuit is infeasible, the early indicator can be provided to the designer (at step 208) so that the designer can re-architect the design. In some examples, a designer can specify a particular partition to be used by the circuit design tool 110. In such a case, some connections between sub-circuits are not marked nets, but are nets derived from a given partition specified by the designer. The frequency of such unmarked nets for SLR crossing should be below a target frequency to successfully cross SLRs (the target frequency depending on the specifications of the device). Some sub-circuits may be already assigned to given SLRs through constraints (e.g., IO or hard block locations are usually fixed for a target device). A sub-circuit can also include marked nets so that the partition can be done gradually from coarser to finer representations.

At step 210, the circuit design tool 110 places the circuit in the target device. The circuit design tool 110 places instances of circuit components specified in the logical description within a physical layout of the target device ("placement"). The circuit design tool 110 can refine the partition during placement, especially early in the placement process. The partitioning does not need to be separated from the placement step. Thus, in some embodiments, the circuit design tool 110 can perform partitioning and placement (steps 208 and 210) concurrently. During detailed placement (step 210) and post-placement optimization (step 212), the circuit design tool 110 can also move logic cells to meet the requirement for SLR crossing, exploiting the properties of the marked nets. By using the marked nets for crossing, the number of SLLs required are reduced with no side effect on timing due to the configuration block described below. The configurable block absorbs the resource cost for SLR crossing, while enabling high-frequency crossing required by multiplexed signals. AS a result, the premise that detailed placement and post-placement optimization would not significantly disturb the existing placement can be maintained. The circuit design tool 110 can use the unmarked nets to cross SLR only if necessary.

In an alternative flow, the designer can specify SLR crossing through constraints on the circuit. Such a flow can try to meet the requirement with the partition given by the designer if possible and resort to the marked nets only if necessary. Optionally, the designer can also indicate the amount of additional latency a net can take before the design becomes non-functional. The circuit design tool can place the design such that the nets whose marker has a high number cross multiple SLRs. In addition, the circuit design tool 110 can add registers to the marked nets to ease timing closure for SLR crossing and placement in general. Another alternative flow applies the method without using the configurable block (described below). In such a flow, the specialized circuits for SLR crossing are implemented in the programmable fabric. Therefore, the applicability of such a flow may be limited to relatively sparser circuits.

In the existing flow, the designer provides only one set of partitions at a time for the tool to try. In contrast, the techniques described herein allows the designer to transfer the knowledge of the design to the circuit design tool 110 so that the circuit design tool 110 can chose the best partition that fits the requirement from several combinations derived from the transferred knowledge. The designer does not need to mark all the nets as allowable to cross SLRs to use the method. However, the more nets marked, the better as it creates a larger solution space for the circuit design tool 110. In addition, the method does not necessarily impose more work on the designer, as in general the designer has a few candidate partitions, but can only iterate through them one by one using the existing flow.

Figure 3:
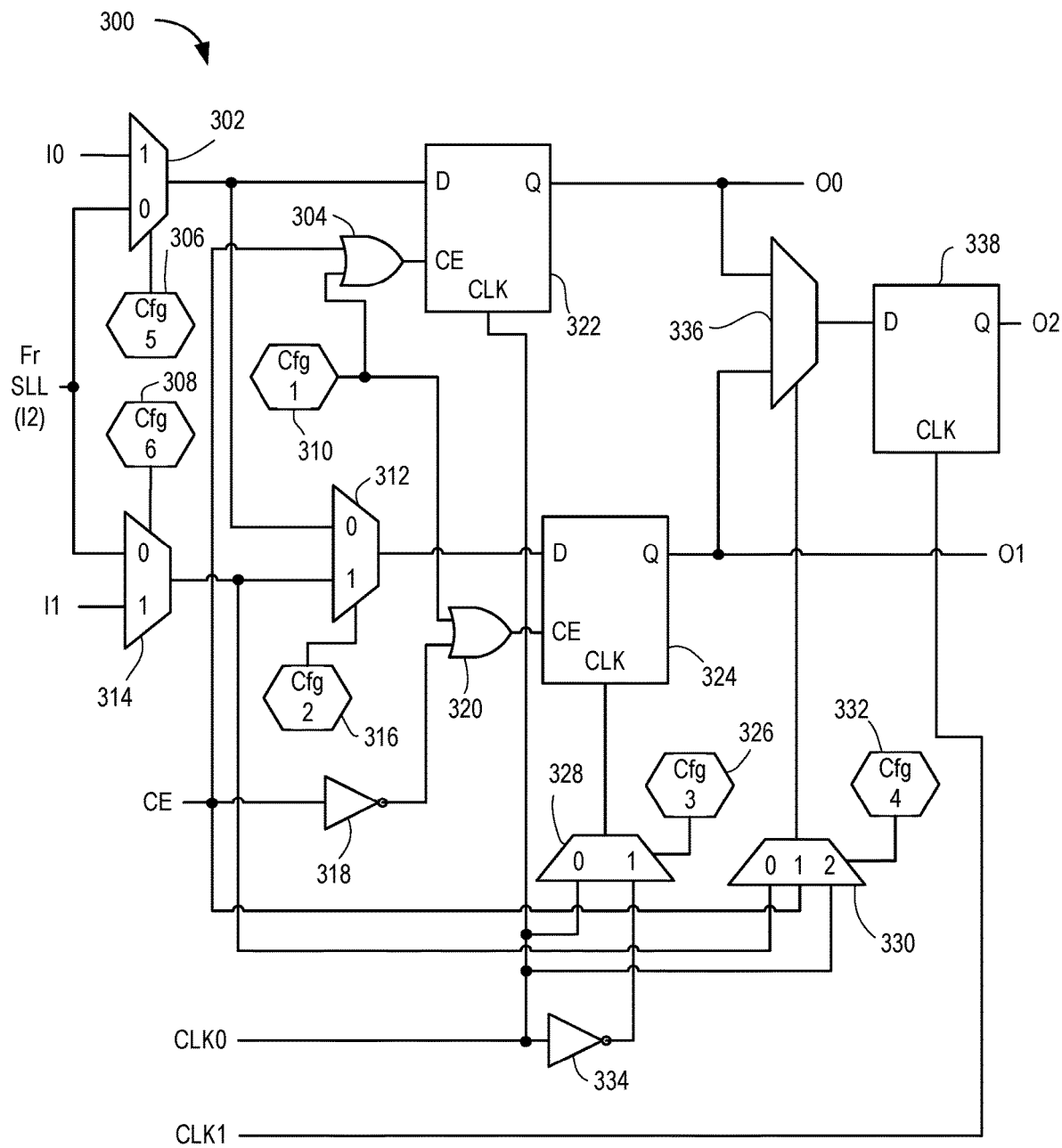
FIG. 3 is a schematic diagram depicting a configurable block for a super logic region (SLR) crossing according to an example.

FIG. 3 is a schematic diagram depicting a configurable block 300 for SLR crossing according to an example. The configurable block 300 comprises multiplexers 302, 312, 314, 328, 330, and 336, flip-flops 322, 324, and 338, logic gates 304, 318, 320, and 334, and memory cells 306, 308, 310, 316, 326, and 332. The memory cells 306, 308, 310, 316, 326, and 332 are part of the configuration memory of the programmable device. In some examples, the multiplexers 302 and 314 are part of an IO block of the programmable device.

Each of the multiplexers 302 and 314 are two input multiplexers. A first input ("0") of the multiplexer 302 is coupled to an SLL of the interposer on which the programmable device is mounted. A second input of the multiplexer 302 is couple to an input I0 of the configurable block 300. A control input of the multiplexer 302 is coupled to the memory cell 306 ("Cfg 5"). A first input of the multiplexer 314 is coupled to the SLL. A second input of the multiplexer 314 is coupled to an input I1 of the configurable block 300. A control input of the multiplexer 314 is coupled to the memory cell 308 ("Cfg 6").

A data input ("D") of the flip-flop 322 is coupled to an output of the multiplexer 302. A clock enable (CE) input of the flip-flop 322 is coupled to an output of the logic gate 304. The logic gate 304 comprises an OR gate having two inputs. A first input of the logic gate 304 is coupled to a clock enable (CE) input of the configurable block 300. A second input of the logic gate 304 is coupled to the memory cell 310 ("Cfg 1"). A clock (CLK) input of the flip-flop 322 is coupled to a clock input (CLK0) of the configurable block 300. An output (Q) of the flip-flop 322 is coupled to an output (O0) of the configurable block 300.

The multiplexer 312 is a two input multiplexer. A first input ("0") of the multiplexer 312 is coupled to the output of the multiplexer 302. A second input ("1") of the multiplexer 312 is coupled to an output of the multiplexer 314. A control input of the multiplexer 312 is coupled to the memory cell 316 ("Cfg 2").

A data ("D") input of the flip-flop 324 is coupled to an output of the multiplexer 312. A clock enable (CE) input of the flip-flop 324 is coupled to an output of the logic gate 320. The logic gate 320 comprises an OR gate having two inputs. A first input of the logic gate 320 is coupled to the memory cell 310 ("Cfg 1"). A second input of the logic gate 320 is coupled to an output of the logic gate 318. The logic gate 318 comprises an inverter. An input of the logic gate 318 is coupled to the CE input of the configurable block 300. The clock (CLK) input of the flip-flop 324 is coupled to an output of the multiplexer 328. An output (Q) of the flip-flop 324 is coupled to an output (O1) of the configurable block 300.

The multiplexer 328 is a two input multiplexer. A first input ("0") of the multiplexer 328 is coupled to a clock input (CLK0) of the configurable block 300. A second input ("1") is coupled to an output of the logic gate 334. The logic gate 334 comprises an inverter. An input of the logic gate 334 is coupled to the CLK0 input of the configurable block 300. A control input of the multiplexer 328 is coupled to the memory cell 326 ("Cfg 3").

The multiplexer 330 comprises a three-input multiplexer. A first input ("0") of the multiplexer 330 is coupled to the output of the multiplexer 314. A second input ("1") of the multiplexer 330 is coupled to the clock enable (CE) input of the configurable block 300. A third input ("2") of the multiplexer 330 is coupled to the CLK0 input of the configurable block 300. A control input of the multiplexer 330 is coupled to the memory cell 332 ("Cfg 4"). An output of the multiplexer 330 is coupled to a control input of the multiplexer 336.

The multiplexer 336 comprises a two input multiplexer. A first input of the multiplexer 336 is coupled to the output (Q) of the flip-flop 322. A second input of the multiplexer 336 is coupled to the output (Q) of the flip-flop 324.

A data (D) input of the flip-flop 338 is coupled to an output of the multiplexer 336. A clock input (CLK) of the flip-flop 338 is coupled to a clock input (CLK1) of the configurable block 300. An output (Q) of the flip-flop 338 is coupled to an output (O2) of the configurable block 300.

In an example, the inputs I0 and I1 of the configurable block 300 are coupled to programmable fabric of the device. The outputs O0 and O2 of the configurable block are coupled to the programmable fabric and another SLL. The output O1 of the configurable block 300 is coupled to the programmable fabric. The CE, CLK0, and CLK1 inputs are coupled to the programmable fabric.

The configurable block 300 can be configured to perform the following functions: (1) multiplexing two signals to be sent to an SLL; (2) de-multiplexing a signal from an SLL into two signals; (3) mesochronous synchronizing a signal from an SLL to the fabric; (4) mesochronous synchronizing a signal from the fabric to an SLL; (5) multiplexing two signals and mesochronous synchronizing from the fabric to an SLL; (6) driving a signal to an SLL through a register; and (7) receiving a signal from an SLL through a register. The configurations of the configurable block 300 are controlled by the memory cells Cfg1 through Cfg 6. The configurations are shown in the following table:

|  | Cfg1 | Cfg2 | Cfg3 | Cfg4 | Cfg5 | Cfg6 |
|---|---|---|---|---|---|---|
| 1, 5) Mux | 1 | 1 | 1 | 1 | 1 | 1 |
| 2) Demux | 0 | 1 | X | X | 0 | 0 |
| 3) Sync to SLL | 0 | 0 | 1 | 1 | 1 | X |
| 4) Sync from SLL | 1 | 0 | 1 | 1 | 0 | X |
| 6) Tx | 1 | X | X | X | 1 | X |
| 7) Rx | 1 | 1 | X | X | X | 0 |

Multiplexing and de-multiplexing are used together to reduce the demand on SLLs by half. Further sharing can be extended using fabric resources or more hardened resources added to configurable block 300. Mesochronous synchronizer is used to nullify the effect of large skew resulting from clock tree manipulation to cross SLRs at high-frequency. In many cases, the multiplexed signal is running at such high frequency that both multiplexing and synchronizing must be used concurrently. When a mesochronous synchronizer is used, flip-flops and lookup-tables (LUTs) can be used from the fabric for each bus crossing SLRs, which is small considering that the typical size of a bus is 256 bits. The configurable block 300 can be bypassed using connection in the interconnect sub-block. Further functionality could be added to the configurable block. For example, one more inputs can be added to the multiplexer 336 that couple to the output of the multiplexer 302. This will allow a skid buffer to be implemented to improve the SLR crossing frequency of a data channel that uses valid-ready handshake. Adding another input to the multiplexer 336 that couple to the output of the multiplexer 312 enables the block to multiplex such a channel to reduce the demand on SLR wires by half. In these use cases, the number of select bits to the multiplexer 336 as well as the number of configuration bits are increased appropriately.

Figure 4:
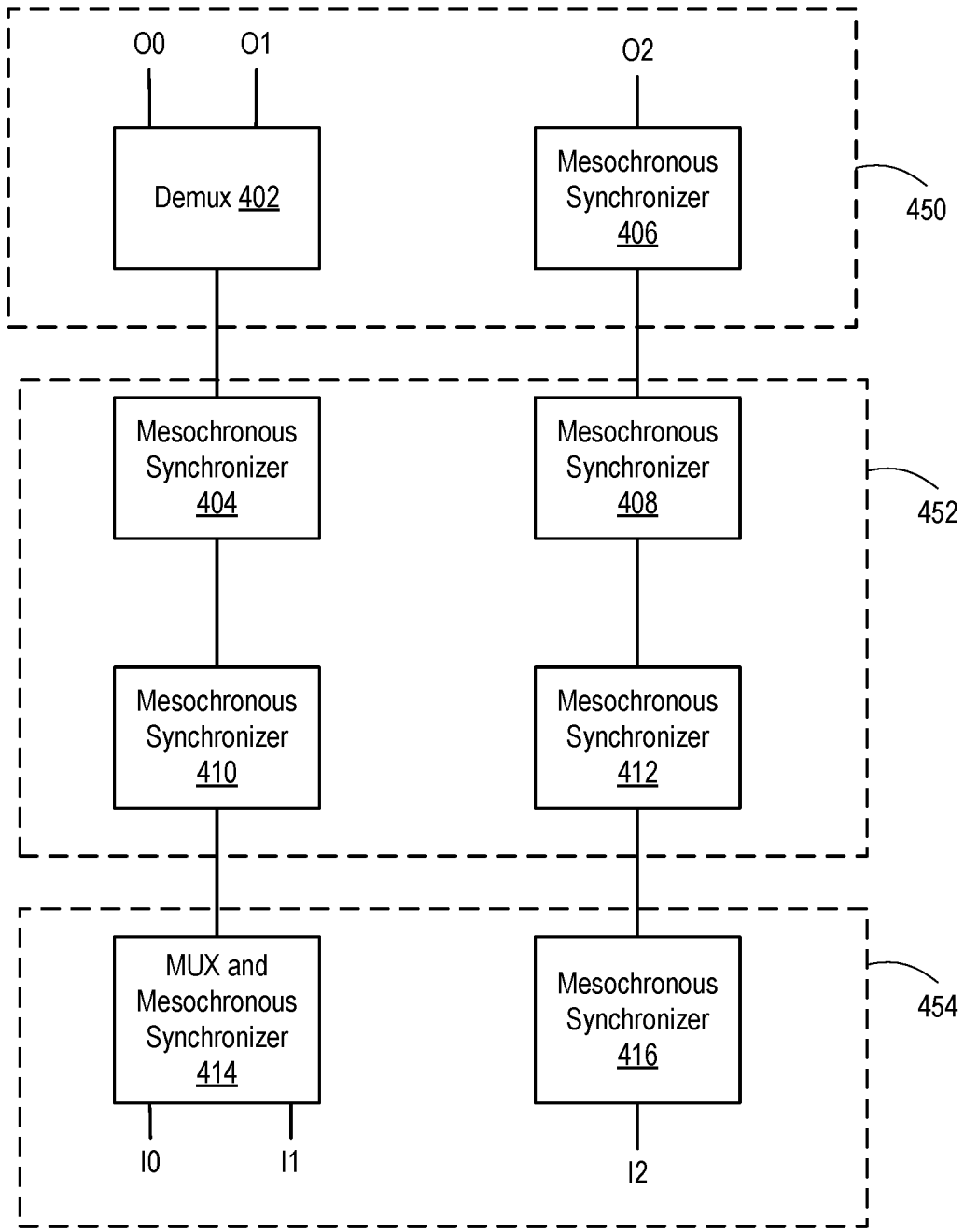
FIG. 4 is a block diagram depicting usage of the configurable blocks across three SLRs according to an example.

FIG. 4 is a block diagram depicting usage of the configurable blocks across three SLRs according to an example. On the left side, the configurable blocks are used to multiplex and de-multiplexer signals on a bus in an SLR 450 and an SLR 452 to reduce SLL demand. In the SLR 450, a configurable block is configured to provide a de-multiplexer 402. In the SLR 452, configurable blocks are configured to provide mesochronous synchronizers 404 and 410. The multiplexed signals run twice as fast as the original frequency. Therefore, some configurable blocks are used in the synchronizer mode to facilitate such high speed crossings. In SLR 454, a configurable block is configured to provide a multiplexer and synchronizer 414. In this manner, input signals I0 and I1 in the SLR 454 are transmitted to outputs O0 and O1 in the SLR 450 through the SLR 452.

On the right side, a configurable block in the SLR 450 is configured to provide a mesochronous synchronizer 406. Configurable blocks in the SLR 452 are configured to provide mesochronous synchronizers 408 and 412. A configurable block in the SLR 454 is configured to provide a mesochronous synchronizer 416. This allows a signal operating at high frequency to be transmitted from SLR 454 to SLR 450 through the SLR 452.

Even/Odd Mesochronous Synchronizer Using No Delay Line

In a large complex application, it is difficult to limit the clock skew throughout the design because of large variations induced by a large physical span. In particular, it is typical for a design implemented on a device having multiple dies on an interposer to use one clock synthesis module per SLR for a given frequency. In such a design, data transfers between two parts of the design that are logically intra-clock-domain become physically inter-clock-domains, if the two parts are placed in different SLRs. A circuit commonly called mesochronous synchronizer must be inserted to properly transfer the data in such a case. "Mesochronous" means that the clocks have the same frequency, but an unknown phase relationship. In the examples described above, the configurable block can be configured to implement a mesochronous synchronizer. Another example of a mesochronous synchronizer is described below.

A versatile asynchronous first-in-first-out (FIFO) can be used as a mesochronous synchronizer. However, the asynchronous FIFO poses both place-ability and route-ability challenges due to discrete LUTRAM locations in the programmable fabric and its large number of control signals. A FIFO design specifically for this task, a three-register mesochronous synchronizer, is more efficient. But the place-ability problem remains, as it requires four control sets. An even/odd synchronizer uses less flip-flops and is thus more area efficient, leading to better place-ability and route-ability. However, known even/odd synchronizers need delay lines in generating data selection to avoid metastability during data transfers. Such a design poses difficultly for application specific integrated circuit (ASIC) design and is not even applicable for implement on programmable fabrics. A mesochronous synchronizer described below includes a circuit to control the even/odd mesochronous synchronizer without using delay lines. The mesochronous synchronizer as described herein is not only smaller than existing circuits, but also applicable for use in programmable fabrics.

Figure 5:
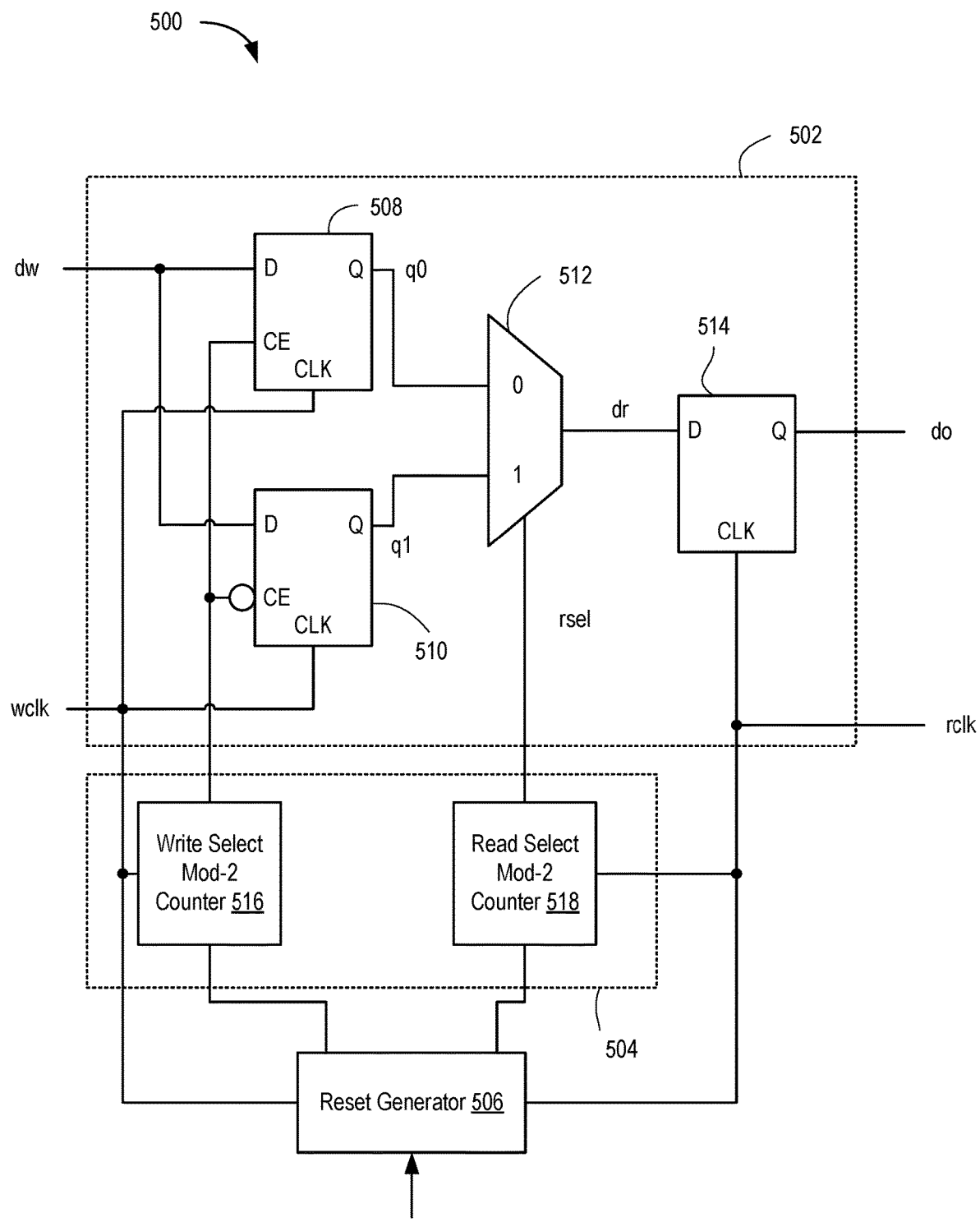
FIG. 5 is a block diagram depicting a mesochronous synchronizer according to an example.

FIG. 5 is a block diagram depicting a mesochronous synchronizer 500 according to an example. The mesochronous synchronizer 500 includes a data path circuit 502, a read/write selector circuit 504, and a reset generator circuit ("reset generator 506"). The data path circuit 502 comprises a flip-flop 508, a flip-flop 510, a multiplexer 512, and a flip-flop 514. The read/write selector circuit 504 comprises a write select mod-2 counter 516 and a read select mod-2 counter 518.

A data input (D) of the flip-flop 508 is coupled to a data input (dw) of the mesochronous synchronizer 500. A clock enable (CE) input of the flip-flop 508 is coupled to an output of the write select mod-2 counter 516. A clock input (CLK) of the flip-flop 508 is coupled to a write clock input (wclk) of the mesochronous synchronizer 500.

A data input (D) of the flip-flop 510 is coupled to the data input (dw). A clock enable (CE) input of the flip-flop 510 is coupled to a logical inversion of the output of the write select mod-2 counter 516 (logical inversion indicated by the bubble at the CE input). A clock (CLK) input of the flip-flop 510 is coupled to the write clock (wclk).

The multiplexer 512 is a two-input multiplexer. A first input of the multiplexer 512 is coupled to an output of the flip-flop 508 (designated q0). A second input of the multiplexer 512 is coupled to an output of the flip-flop 510 (designated q1). An input (D) of the flip-flop 514 is coupled to an output of the multiplexer 512. A clock (CLK) input of the flip-flop 514 is coupled to a read clock input (rclk) of the mesochronous synchronizer 500. An output (Q) of the flip-flop 514 is coupled to a data output (do) of the mesochronous synchronizer 500.

A clock input of the write select mod-2 counter 516 is coupled to the write clock (wclk). A clock input of the read select mod-2 counter 518 is coupled to the read clock (rclk). An output of the read select mod-2 counter 518 is coupled to a control input of the multiplexer 512. Inputs of the write select mod-2 counter 516 and the read select mod-2 counter 518 are coupled to respective first and second outputs of the reset generator 506. A first input of the reset generator 506 is coupled to the write clock (wclk). A second input of the reset generator 506 is coupled to the read clock (rclk).

In operation, the write select mod-2 counter 516 and the read select mod-2 counter 518 are initialized to opposite values. The write select mod-2 counter 516 enables/disables the flip-flops 508 and 510 based on the write clock (wclk). The read select mod-2 counter 518 controls the multiplexer 512 to select either q0 or q1 based on the read clock (rclk). The flip-flop 514 samples the output of the multiplexer 512 and provides the output of the synchronizer based on the read clock (rclk). The data path circuit 502 and the read/write select circuit 504 are configured to ensure that data can be correctly transferred every clock cycle as long as the write select mod-2 counter 516 is reset within the target clock period before the read select mod-2 counter 518. This condition is guaranteed by the reset generator 506. The structure and function of the reset generator 506 is described below. While the data path circuit 502 shows only a single data path for one signal (dw), in general the data path circuit 502 can include a plurality of data paths constructed identically for a plurality of signals.

Figure 6:
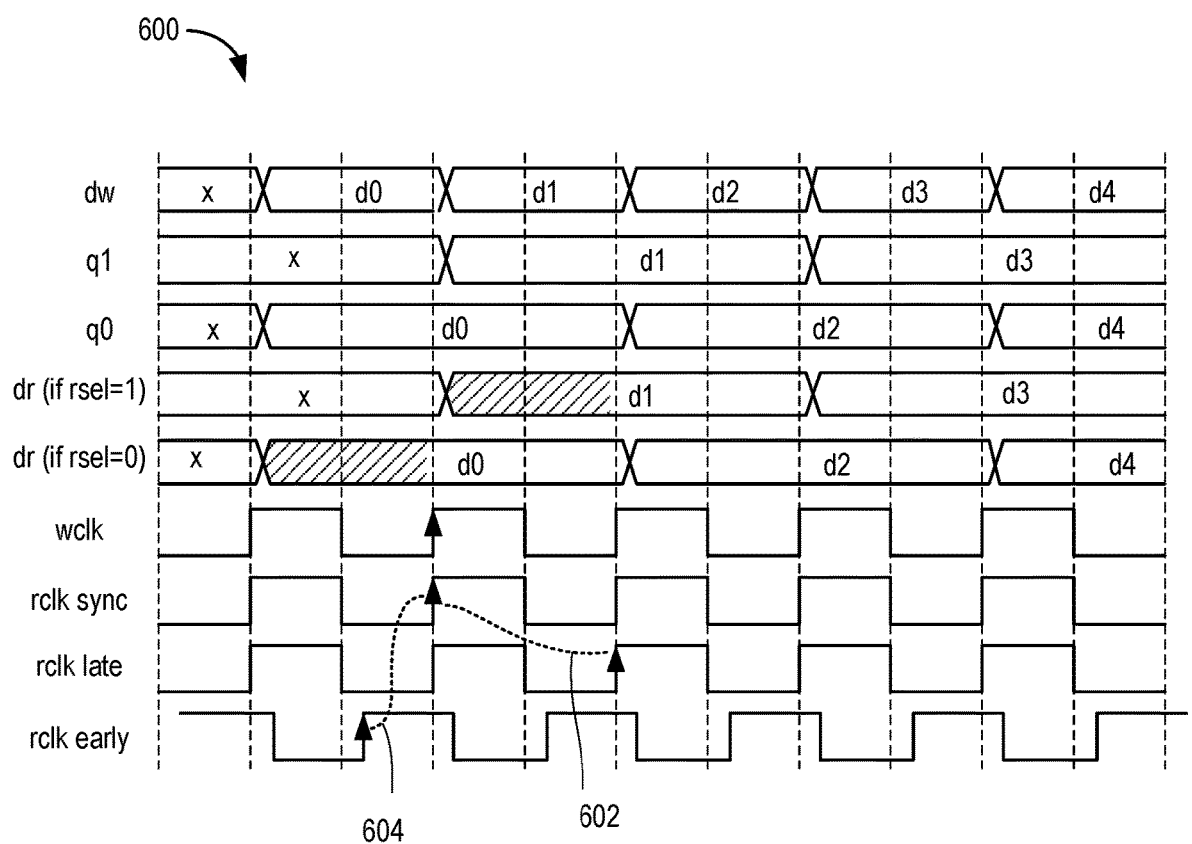
FIG. 6 depicts a timing diagram for the mesochronous synchronizer of FIG. 5 according to an example.

FIG. 6 depicts a timing diagram 600 for the mesochronous synchronizer 500 according to an example. The timing diagram 600 shows the data input (dw), the output of the flip-flop 510 (q1), the output of the flip-flop 508 (q0), and the output of the multiplexer 512 for each condition of rsel=1 and rsel=0. The shaded portions show the amount of acceptable propagation delay up to T, the period of the clock signal. The arrow on wclk indicates a write to q1. The arrows on the rclk signals indicate a read from q0. Reference 602 indicates a positive skew between the write clock and the read clock (e.g., rclk late). Reference 604 indicates a negative skew between the write clock and the read clock (e.g., rclk early). It is permissible in the circuit to read from q0 late (e.g., positive skew). However, q0 cannot be read early (e.g., negative skew). The reset generator 506 is configured to arrange for positive skew and prevent negative skew.

Figure 7:
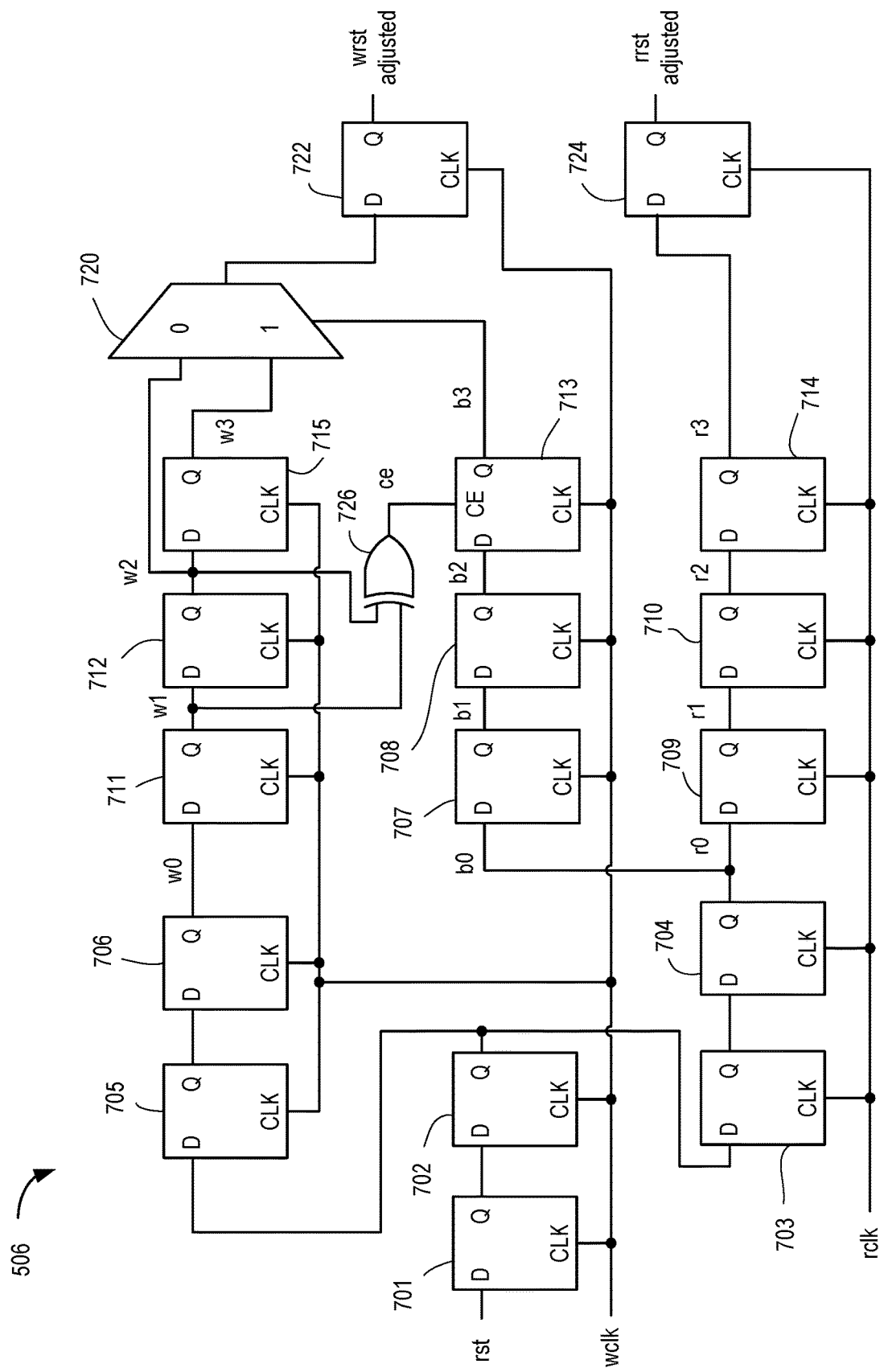
FIG. 7 is a block diagram depicting a reset generator according to an example.

FIG. 7 is a block diagram depicting the reset generator 506 according to an example. The reset generator 506 includes flip-flops 701 through 715, a multiplexer 720, a logic gate 726, and optionally flip-flops 722 and 724. A data input (D) of the flip-flop 701 is coupled to receive a reset signal (rst). A data output (Q) of the flip-flop 701 is coupled to a data input (D) of the flip-flop 702. A data output (Q) of the flip-flop 702 is coupled to a data input (D) of the flip-flop 705 and a data input (D) of the flip-flop 703.

A data output (Q) of the flip-flop 705 is coupled to a data input (D) of the flip-flop 706. A data output (Q) of the flip-flop 706 is coupled to a data input (D) of the flip-flop 711. A data output (Q) of the flip-flop 711 is coupled to a data input (D) of the flip-flop 712. A data output (Q) of the flip-flop 712 is coupled to a data input (D) of the flip-flop 715.

A data output (Q) of the flip-flop 703 is coupled to a data input (D) of the flip-flop 704. A data output (Q) of the flip-flop 704 is coupled to a data input (D) of the flip-flop 709 and a data input (D) of the flip-flop 707. A data output (Q) of the flip-flop 709 is coupled to a data input (D) of the flip-flop 710. A data output (Q) of the flip-flop 710 is coupled to a data input (D) of the flip-flop 714. A data output (Q) of the flip-flop 714 is coupled to a data input (D) of the flip-flop 724 (if present).

A data output (Q) of the flip-flop 707 is coupled to a data input (D) of the flip-flop 708. A data output (Q) of the flip-flop 708 is coupled to a data input (D) of the flip-flop 713. A data output (Q) of the flip-flop 713 is coupled to a control input of the multiplexer 720. The multiplexer 720 is a two input multiplexer. A first input of the multiplexer 720 is coupled to the data output (Q) of the flip-flop 712. A second input of the multiplexer 720 is coupled to the data output (Q) of the flip-flop 715. An output of the multiplexer 720 is coupled to a data input (D) of the flip-flop 722 (if present). The logic gate 726 is an exclusive OR gate. A first input of the logic gate 726 is coupled to the output (Q) of the flip-flop 712. A second input of the logic gate 726 is coupled to the output (Q) of the flip-flop 711. An output of the logic gate 726 is coupled to a clock enable (CE) input of the flip-flop 713. The write clock (wclk) is coupled to the clock inputs of the flip-flops 701, 702, 707, 708, 713, and 722 (if present), as well as the flip-flops 705, 706, 711, 712, and 715. The read clock (rclk) is coupled to the clock inputs of the flip-flops 703, 704, 709, 710, 714, and 724 (if present).

In operation, the flip-flops 701 and 702 function to synchronize the reset to the write clock, and the flip-flops 703 and 704 function to synchronize the reset to the read clock. The flip-flops 707, 708, and 713, and the logic gate 726, function to detect a timing relation between write and read resets. The flip-flops 705, 706, 711, 712, and 715 function to add latency for the write reset to wait for the decision. The flip-flops 709, 710, and 714 function to add latency for the read reset to wait for the decision. The multiplexer 720 functions to move the write reset earlier by one clock cycle if the read reset is early. The flip-flops 722 and 724 can be present if necessary for timing closure. Otherwise, they can be omitted.

Figure 8:
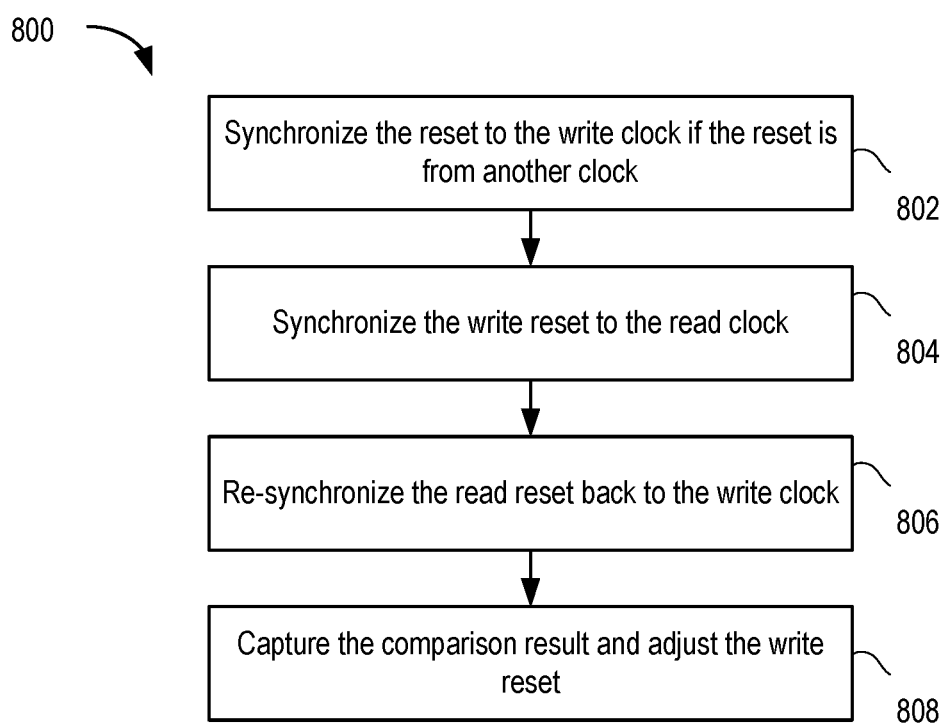
FIG. 8 is a flow diagram depicting a method of obtaining positive reset skew using the reset generator of FIG. 7 according to an example.

FIG. 8 is a flow diagram depicting a method 800 of obtaining positive reset skew using the reset generator 506 according to an example. The method 800 begins at step 802, where the flip-flops 701 and 702 synchronize the reset (rst) to the write clock (wclk). If the reset (rst) is in the write clock (wclk) domain already, the flip-flops 701 and 702 can be omitted and the step 802 can be omitted. At step 804, the flip-flops 703, and 704 synchronize the write reset to the read clock. At step 806, the flip-flops 707 and 708 re-synchronize the read reset back to the write clock (wclk). At step 808, the flip-flops 711, 712, 713, 714 and 715, and the multiplexer 720 capture the comparison result and adjust the write reset.

The resulting synchronized reset can be either before or after the original reset depending on the propagation delay between the two synchronizer chains, i.e., between flip-flops 702 and 703 and between flip-flops 704 and 707, as well as how long it takes to settle from metastability. To determine the timing relation between the two resets, it is necessary to synchronize the read reset back to the write clock (wclk) using the flip-flops 707 and 708. At the same time, read and write resets are delayed by the flip-flops 709 and 710, and flip-flops 711 and 712, respectively. The re-synchronized reset can be early, aligned, or late compared to the reference, which is a delayed write reset. In the aligned result, it cannot be distinguished that the read reset after the first synchronization is early or late. Thus, it is considered as if the read reset is late and the circuit ties to bound the error if the read reset is in fact early. To detect the early re-synchronized reset, a one-cycle pulse is created from the leading edge of the write reset (input and output of the flip-flop 712). If the re-synchronized reset is early, the pulse will allow the flip-flop 713 to capture '0' value and will select the output of the flip-flop 712 as the write reset that is faster than the read reset that has to go through the flip-flop 714, arranging the write reset to be applied before the read reset. If the flip-flop 713 captures a '1' value, the aligned and late cases, the output of the flip-flop 715 will be selected as the output write reset, which has comparable latency with the output read reset from the flip-flop 714, maintaining the already correct reset order.

Even if the read reset is early, the circuit could mistakenly determine that the read reset is late. One possible cause is when the re-synchronization creates metastability at flip-flop 707 and settles late. Such a situation is difficult to detect at runtime with reasonable area cost. A better cost-effective solution is to bound the skew error in the reset generator and make the data path (502) tolerate such a small error. Let T be the clock period. By limiting the minimum propagation delay from flip-flop 702 to flip-flop 703 from d<T, in addition to setting maximum delay to no larger than T, we can bound the skew between read and write clocks that cause misclassification. With both minimum and maximum delay constraints, whenever read reset is detected as earlier than write reset, it is guaranteed that read reset is earlier than write reset by at most T-d. To tolerate for possible skew error up to T-d, the maximum delay in the data path must be limited to d. The value T-d must be reasonable for the design tool to close timing. The exact value of d depends on the target clock frequency and silicon technology. Setting d=3T/4 is reasonable for most cases.

Figure 9:
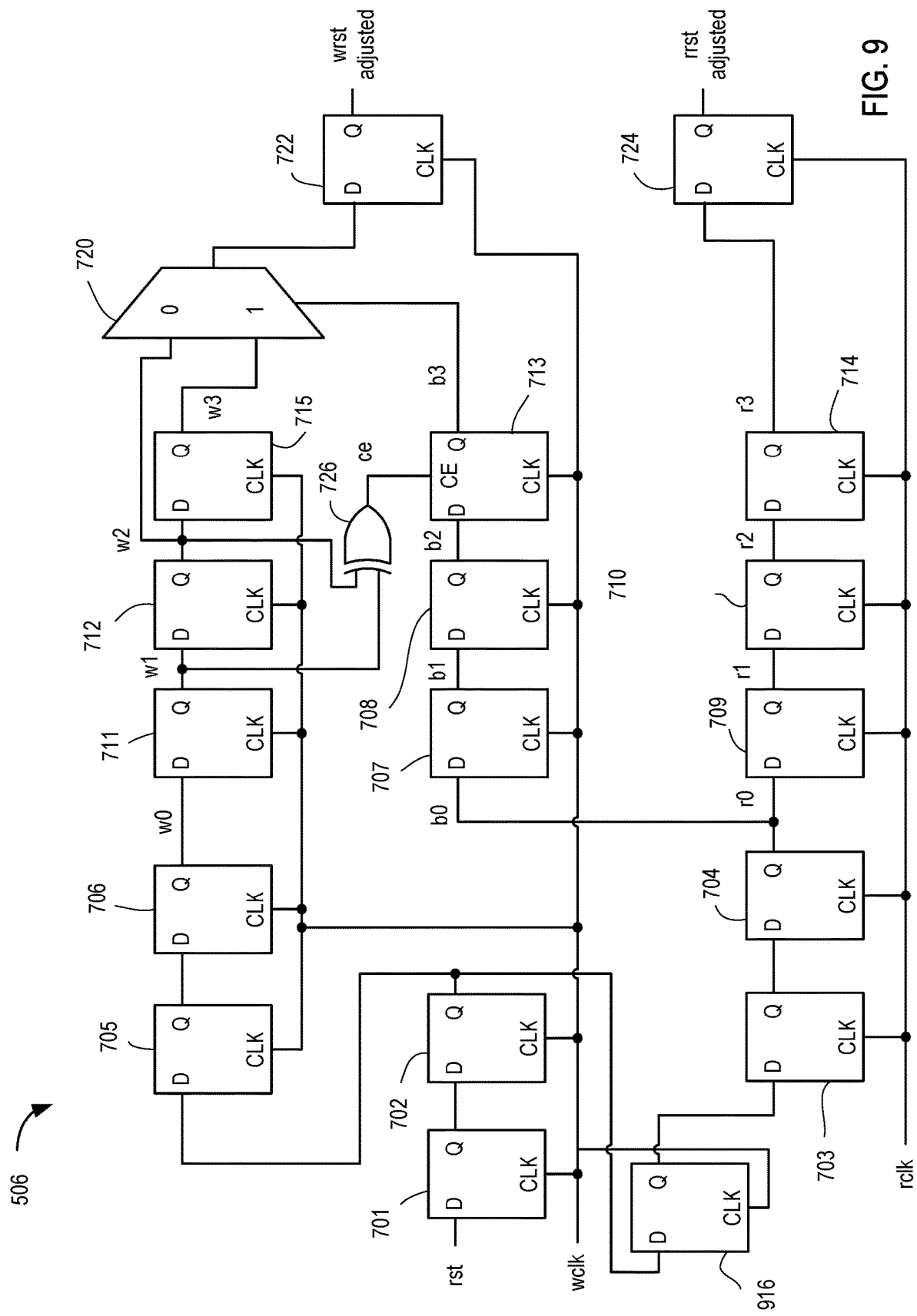
FIG. 9 is a block diagram depicting the reset generator according to another example.

FIG. 9 is a block diagram depicting the reset generator 506 according to another example. Elements of FIG. 9 that are the same or similar to those of FIG. 7 are designated with identical reference numerals. As shown in FIG. 9, the reset generator 506 includes an additional flip-flop 916. A data input (D) of the flip-flop 916 is coupled to the data output (Q) of the flip-flop 702. A data output (Q) of the flip-flop 916 is coupled to the data input (D) of the flip-flop 703. Thus, the data input (D) of the flip-flop 703 is no longer directly coupled to the data output (Q) of the flip-flop 702, but is coupled through the flip-flop 916. A clock input (CLK) of the flip-flop 916 is coupled to receive a clock derived from the write clock (wclk), i.e., a shifted version of the write clock. In this example, the timing constraints are simplified by the addition of the flip-flop 916.

Figure 10:
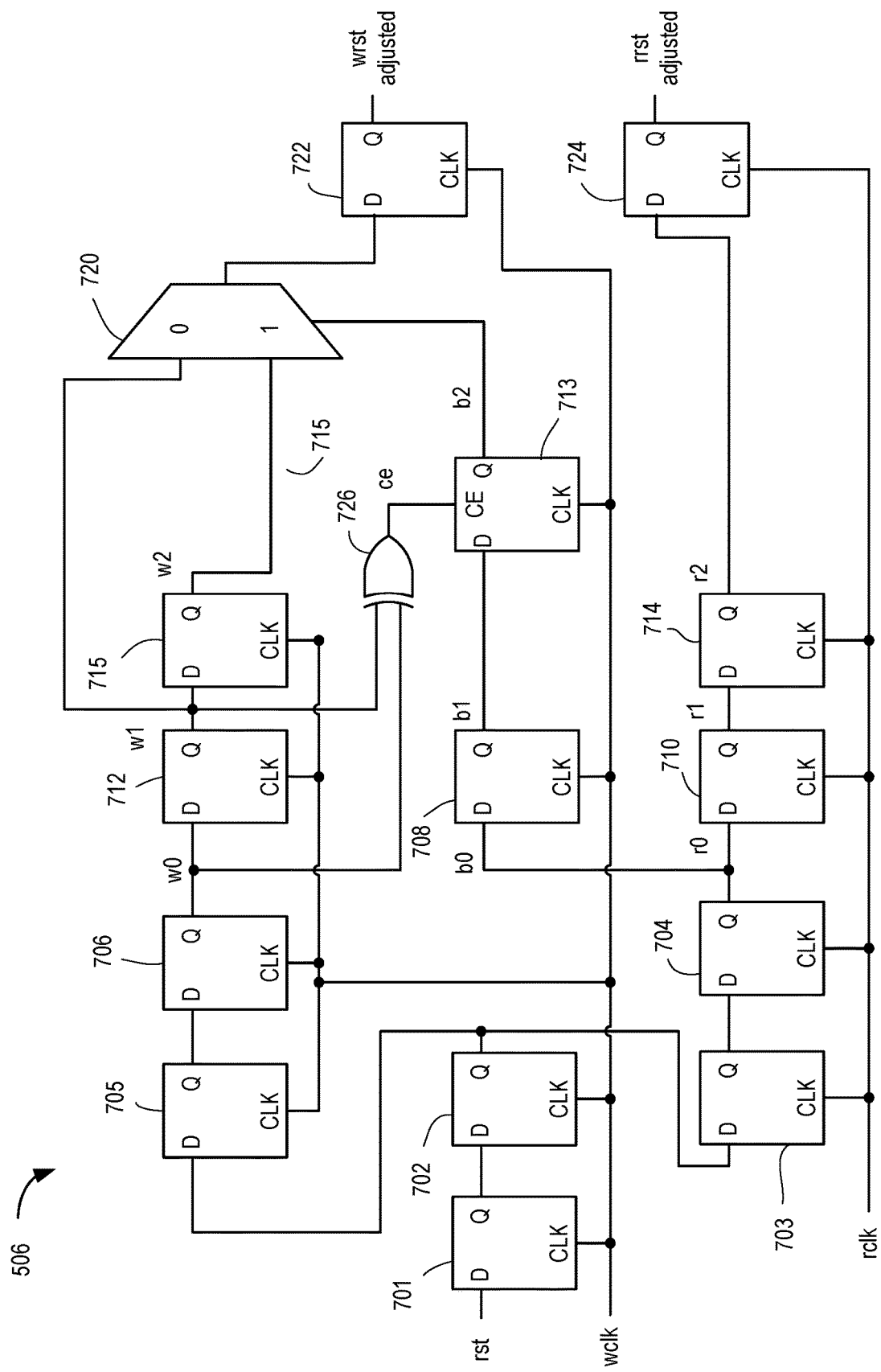
FIG. 10 is a block diagram depicting a reset generator according to another example.

FIG. 10 is a block diagram depicting the reset generator 506 according to another example. Elements of FIG. 10 that are the same or similar to those of FIG. 7 are designated with identical reference numerals. In this example, the flip-flop 711 is removed as the pair of flip-flop 712 and 715 can assume the role of the flip-flop pair 711 and 712. Similarly, the flip-flop 707 and 709 can be removed. As a result, the output (Q) of the flip-flop 706 is coupled directly to the input (D) of the flip-flop 712. The output (Q) of the flip-flop 704 is coupled to the input (D) of the flip-flop 708 and 710. Otherwise, the reset generator 506 operates as described above. The implementation of the reset generator 506 shown in FIG. 10 includes the theoretical minimum number of flip-flops for functioning.

Figure 11:
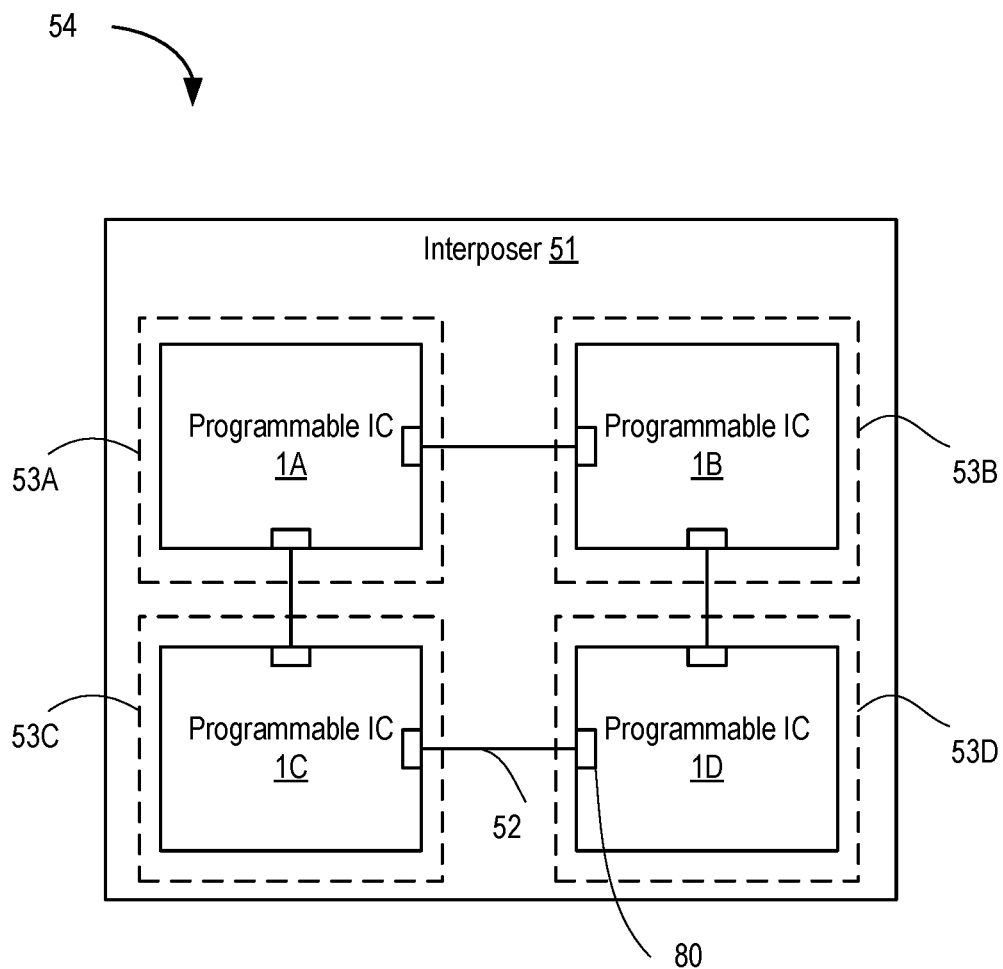
FIG. 11 is a block diagram depicting a programmable device according to an example.

FIG. 11 is a block diagram depicting a programmable device 54 according to an example. The programmable device 54 includes a plurality of programmable integrated circuits (ICs) 1, e.g., programmable ICs 1A, 1B, 1C, and 1D. In an example, each programmable IC 1 is an IC die disposed on an interposer 51. Each programmable IC 1 comprises a super logic region (SLR) 53 of the programmable device 54, e.g., SLRs 53A, 53B, 53C, and 53D. The programmable ICs 1 are interconnected through conductors on the interposer 51 (referred to as super long lines (SLLs) 52). The programmable ICs 1 include interface circuits coupled to the SLLs 52 referred to as SLL-fabric interface (IF) blocks 80. The SLL-fabric IF blocks 80 provide an interface between the programmable fabric of a programmable IC 1 and an SLL 52.

Figure 12:
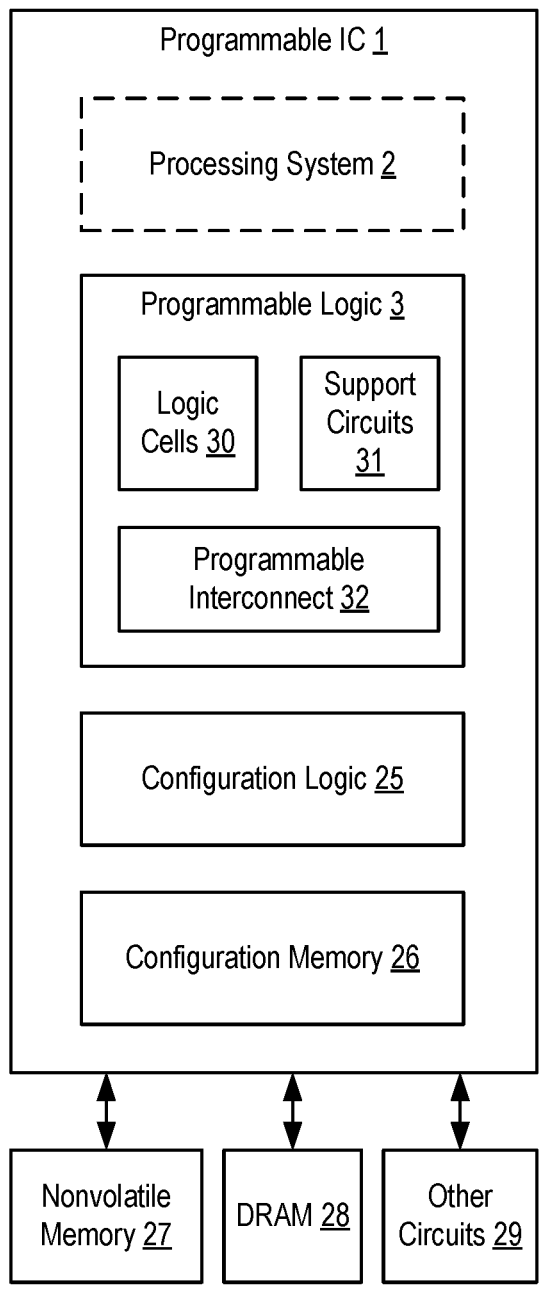
FIG. 12 is a block diagram depicting a programmable integrated circuit (IC) according to an example in which the configurable block described herein can be used.

FIG. 12 is a block diagram depicting a programmable IC 1 according to an example in which the configurable blocks 300 described herein can be used. The programmable IC 1 includes programmable logic 3, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like.

Figure 13:
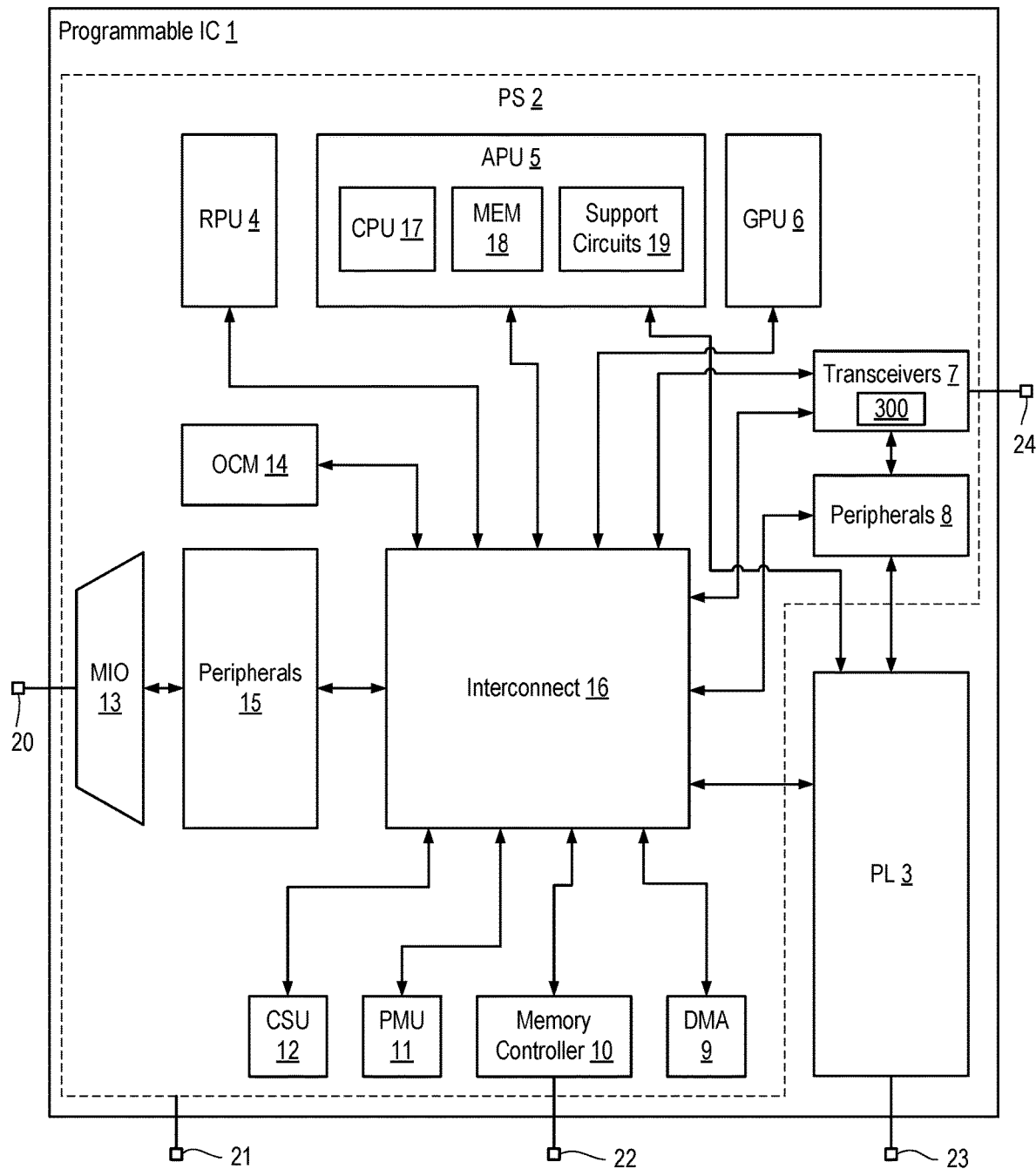
FIG. 13 is a block diagram depicting a System-on-Chip (SoC) implementation of a programmable IC according to an example.

FIG. 13 is a block diagram depicting a System-on-Chip (SoC) implementation of the programmable IC 1 according to an example. In the example, the programmable IC 1 includes the processing system 2 and the programmable logic 3. The processing system 2 includes various processing units, such as a real-time processing unit (RPU) 4, an application processing unit (APU) 5, a graphics processing unit (GPU) 6, a configuration and security unit (CSU) 12, a platform management unit (PMU) 122, and the like. The processing system 2 also includes various support circuits, such as on-chip memory (OCM) 14, transceivers 7, peripherals 8, interconnect 16, DMA circuit 9, memory controller 10, peripherals 15, and multiplexed IO (MIO) circuit 13. The processing units and the support circuits are interconnected by the interconnect 16. The PL 3 is also coupled to the interconnect 16. The transceivers 7 are coupled to external pins 24. The PL 3 is coupled to external pins 23. The memory controller 10 is coupled to external pins 22. The MIO 13 is coupled to external pins 20. The PS 2 is generally coupled to external pins 21. The APU 5 can include a CPU 17, memory 18, and support circuits 19.

Referring to the PS 2, each of the processing units includes one or more central processing units (CPUs) and associated circuits, such as memories, interrupt controllers, direct memory access (DMA) controllers, memory management units (MMUs), floating point units (FPUs), and the like. The interconnect 16 includes various switches, busses, communication links, and the like configured to interconnect the processing units, as well as interconnect the other components in the PS 2 to the processing units.

The OCM 14 includes one or more RAM modules, which can be distributed throughout the PS 2. For example, the OCM 14 can include battery backed RAM (BBRAM), tightly coupled memory (TCM), and the like. The memory controller 10 can include a DRAM interface for accessing external DRAM. The peripherals 8, 15 can include one or more components that provide an interface to the PS 2. For example, the peripherals 15 can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose IO (GPIO) ports, serial advanced technology attachment (SATA) ports, PCIe ports, and the like. The peripherals 15 can be coupled to the MIO 13. The peripherals 8 can be coupled to the transceivers 7. The transceivers 7 can include serializer/deserializer (SERDES) circuits, MGTs, and the like.

Figure 14:
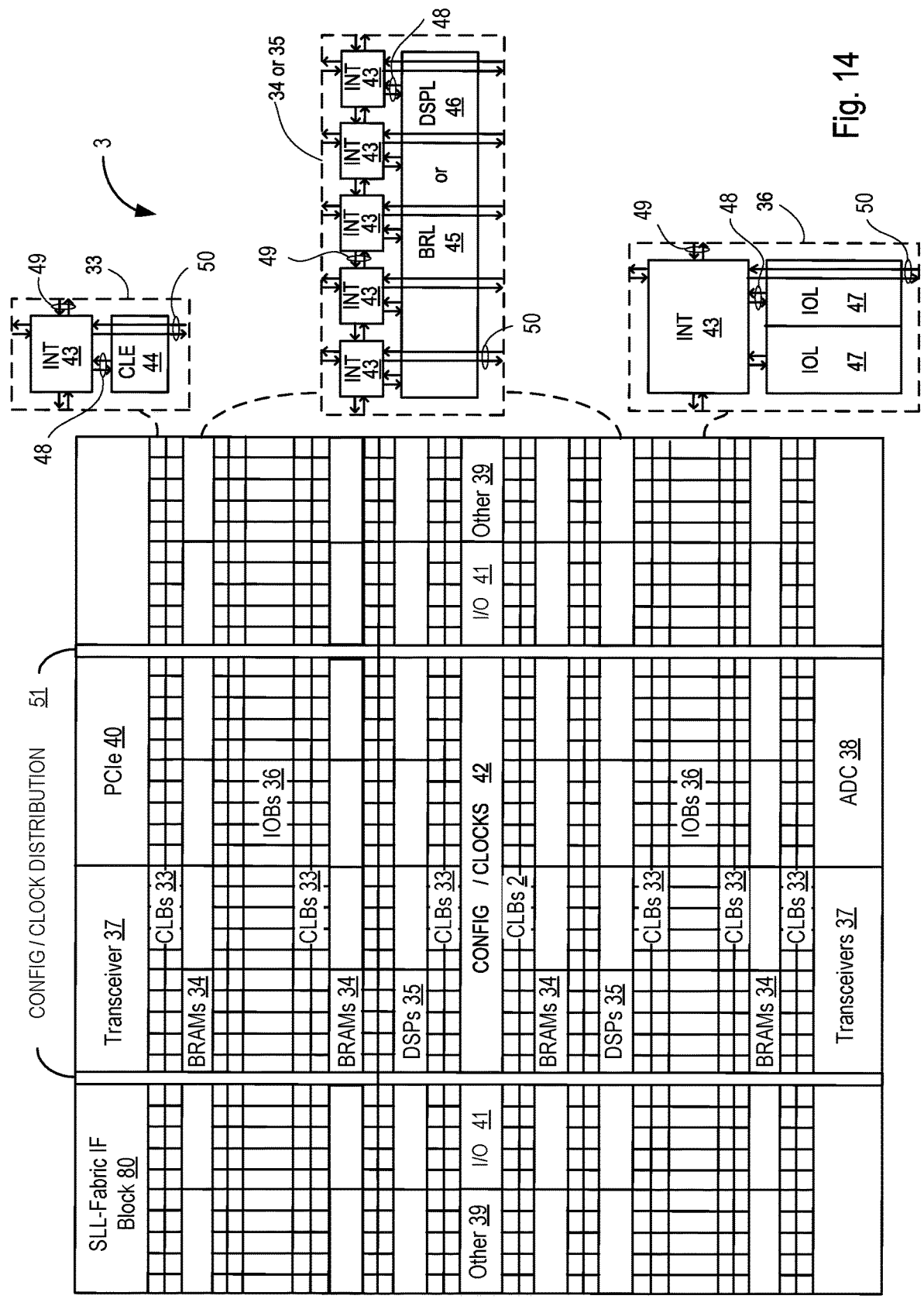
FIG. 14 illustrates a field programmable gate array (FPGA) implementation of a programmable IC.

FIG. 14 illustrates a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like. The FPGA can include instance(s) of the SLL-fabric IF block 80 for coupling the programmable fabric to SLL(s) on an interposer.

In some FPGAs, each programmable tile can include at least one programmable interconnect element ("INT") 43 having connections to input and output terminals 48 of a programmable logic element within the same tile, as shown by examples included at the top of FIG. 10. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 10) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 14 include additional logic blocks that disrupt the regular columnar structure making up a large part of the FPGA. The additional logic blocks can be programmable blocks and/or dedicated logic. Note that FIG. 14 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 14 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A device comprising:
    an integrated circuit (IC) comprising a configurable block and an interface block, wherein the configurable block comprises:
        a first flip-flop having (i) a data port configured to be selectively coupled to an output of the interface block, (ii) a clock port coupled to a first clock input of the configurable block, and (iii) an output port coupled to a first output of the configurable block;
        a second flip-flop having (i) a data port configured to be selectively coupled to the output of the interface block, (ii) a clock port configured to be selectively coupled to the first clock input, and (iii) an output port coupled to a second output of the configurable block;
        a first multiplexer having (i) a first input port coupled to the output port of the first flip-flop, and (ii) a second input port coupled to the output port of the second flip-flop; and
        a third flip-flop having (i) an input port coupled to an output port of the first multiplexer, (ii) a clock port coupled to a second clock input of the configurable block, and (iii) an output port coupled to a third output of the configurable block.

2. The device of claim 1, wherein the configurable block further comprises:
    a second multiplexer having a first input port coupled to a first input of the configurable block, a second input port coupled to a second input of the configurable block, and an output port coupled to the data port of the first flip-flop, the first input of the configurable block being coupled to the output of the interface block; and
    a third multiplexer having a first input port coupled to the first input, a second input port coupled to a third input of the configurable block, and an output port coupled to the data port of the second flip-flop.

3. The device of claim 2, wherein:
    the first input is coupled to a conductor on an interposer;
    the IC being mounted on the interposer;
    the IC is a programmable IC; and
    the second input and the third input are coupled to programmable fabric of the programmable IC.

4. The device of claim 2, wherein the configurable block further comprises:
    a fourth multiplexer having a first input port coupled to the output port of the second multiplexer, a second input port coupled to the output port of the third multiplexer, and an output port coupled to the data port of the second flip-flop.

5. The device of claim 1, wherein the configurable block further comprises:
    a first logic gate having a first input port coupled to a clock enable (CE) input of the configurable block, a second input port coupled to a first memory cell, and an output port coupled to a CE port of the first flip-flop; and
    a second logic gate having a first input port coupled to the first memory cell, and an output port coupled to a CE port of the second flip-flop; and
    an inverter coupled between the CE input and a second input port of the second logic gate.

6. The device of claim 1, wherein the configurable block further comprises:
    a second multiplexer having a first input port coupled to the first clock input, and an output port coupled to the clock port of the second flip-flop;
    an inverter coupled between the first clock input and a second input port of the second multiplexer; and
    a third multiplexer having a first input port coupled to the output of the interface block, a second input port coupled a clock enable (CE) input of the configurable block, a third input port coupled to the first clock input, and an output port coupled to a control port of the first multiplexer.

7. The device of claim 1, wherein:
    the first output and the third output are coupled to respective conductors on an interposer;
    the IC is mounted on the interposer;
    the IC is a programmable IC; and
    the first output, the second output, and the third output are coupled to programmable fabric of the programmable IC.

8. The device of claim 1, further comprising:
    an interposer, wherein:
    the IC is mounted on the interposer;
    the IC is a programmable IC; and
    wherein the programmable IC further includes a programmable fabric.

9. The device of claim 1, wherein the configurable block further comprises one or more multiplexers selectively coupling:
   the data port of the first flip-flop to the output of the interface block and a first input of the configurable block; and
   the data port of the second flip-flop to the output of the interface block, the first input of the configurable block, and a second input of the configurable block.

10. The device of claim 9, wherein the configurable block is configurable to provide multiplexing functionality for a signal on the first input of the configurable block and a signal on the second input of the configurable block to the third output of the configurable block.

11. The device of claim 9, wherein the configurable block is configurable to provide demultiplexing functionality for a signal on the output of the interface block to the first output of the configurable block and the second output of the configurable block.

12. The device of claim 9, wherein the configurable block is configurable to provide mesochronous synchronizing functionality for a signal on the output of the interface block to the third output of the configurable block.

13. The device of claim 9, wherein the configurable block is configurable to provide mesochronous synchronizing functionality for a signal on the first input of the configurable block to the third output of the configurable block.

14. The device of claim 9, wherein the configurable block is configurable to provide transmission functionality for a signal on the first input of the configurable block to the first output of the configurable block.

15. The device of claim 9, wherein the configurable block is configurable to provide receiver functionality for a signal on the output of the interface block to the second output of the configurable block.

16. The device of claim 1, wherein the configurable block further comprises:
   a second multiplexer having a first input port coupled to the output of the interface block, a second input port coupled to a first input of the configurable block, and an output port coupled to the data port of the first flip-flop; and
   a third multiplexer having a first input port coupled to the output of the interface block and a second input port coupled to a second input of the configurable block;
   a fourth multiplexer having a first input port coupled to the output port of the second multiplexer, a second input port coupled to an output port of the third multiplexer, and an output port coupled to the data port of the second flip-flop;
   a first OR gate having a first input port coupled to a clock enable (CE) input of the configurable block, a second input port coupled to a first memory cell, and an output port coupled to a CE port of the first flip-flop; and
   a second OR gate having a first input port coupled to the first memory cell, and an output port coupled to a CE port of the second flip-flop; and
   a first inverter coupled between the CE input and a second input port of the second OR gate;
   a fifth multiplexer having a first input port coupled to the first clock input, and an output port coupled to the clock port of the second flip-flop;
   a second inverter coupled between the first clock input and a second input port of the second multiplexer; and
   a sixth multiplexer having a first input port coupled to the output port of the third multiplexer, a second input port coupled the CE input, a third input port coupled to the first clock input, and an output port coupled to a control port of the first multiplexer.

* * * * *